United States Patent
Apel

[19]

[11] Patent Number: 5,826,183
[45] Date of Patent: Oct. 20, 1998

[54] CIRCUIT FOR SIMULTANEOUS FREQUENCY DOUBLER AND MIXER

[75] Inventor: Thomas R. Apel, Plano, Tex.

[73] Assignee: Samsung Electronics Co., Ltd., Seoul, Rep. of Korea

[21] Appl. No.: 811,625

[22] Filed: Mar. 5, 1997

[51] Int. Cl.⁶ .................................................. H04B 1/26
[52] U.S. Cl. ........................ 455/326; 327/122; 455/333
[58] Field of Search .................................. 327/116, 119, 327/120, 121, 355, 356, 361, 113, 122; 331/37, 43; 455/118, 313, 318, 323, 326, 332, 333

[56] References Cited

U.S. PATENT DOCUMENTS

| | | | |
|---|---|---|---|
| 4,400,630 | 8/1983 | Owen | 327/119 |
| 4,513,250 | 4/1985 | Harman | 327/119 |
| 4,814,649 | 3/1989 | Young | 327/113 |
| 5,444,399 | 8/1995 | Shiga | 327/355 |
| 5,559,457 | 9/1996 | Uda et al. | 327/116 |
| 5,602,501 | 2/1997 | Shiga . | |
| 5,661,424 | 8/1997 | Tang | 327/116 |
| 5,689,207 | 11/1997 | Nakatsuka et al. | 327/355 |

FOREIGN PATENT DOCUMENTS

| | | | |
|---|---|---|---|
| H6-334440 | 12/1994 | Japan | H03D 7/14 |

*Primary Examiner*—Nguyen Vo
*Assistant Examiner*—Makoto Aoki
*Attorney, Agent, or Firm*—Townsend and Townsend and Crew LLP

[57] ABSTRACT

A circuit for simultaneously mixing two input signals and providing an output signal at double the frequency of one of the input signals includes a push-push doubler formed of dual-input mixing elements. Each input signal is coupled to the doubler/mixer through a phase-inverter to provide odd-mode input signal components.

3 Claims, 2 Drawing Sheets

CIRCUIT FOR SIMULTANEOUS FREQUENCY DOUBLER AND MIXER

BACKGROUND OF THE INVENTION

1. Field of the Invention

The present invention relates generally to high frequency conversion circuits and more particularly to circuits for mixing and multiplying frequency components of multiple input signals.

2. Description of the Relevant Art

Circuits for mixing the frequency components of signals and for generating harmonics of frequency components of input signals are well-known. For example, a dual gate FET will mix frequency components of signals applied to each gate and a non-linear device such as an amplifier biased for highly non-linear operation can be used to generate harmonics of the frequency components of an input signal.

Frequency mixers are used in transceiver circuits to mix an input signal at an input infrequency (Fin) with a local oscillator signal (LO) to form a converted signal at an intermediate frequency (IF).

Frequency converters (mixers) can be used to convert an input signal up or down in frequency. Since the principal products of such a circuit are the sum and difference frequencies, in addition to the input (Fin and LO) signals, when up-conversion is desired the frequency sum is utilized. Similarly, down-conversion utilizes the frequency difference.

If the up-conversion IF is much higher than Fin then it is difficult to filter the LO from the intermediate frequency signal because IF and the frequency of LO are almost the same. For this reason, if the up-conversion IF is much higher than Fin a double conversion circuit is advantageous. Double conversion employs two mixers to mix two different local oscillator signals (LO1 and LO2) with the input signal so that neither LO1 nor LO2 is near IF. Thus, filtering of LO1 and LO2 from the mixed signal is less difficult.

From the standpoint of circuit size, a single LO is more desirable. It is possible to obtain the benefits of double conversion from a single LO frequency source by selecting $LO_2$ frequency as an integral multiple of the $LO_1$ frequency. Then $LO_1$ can be generated by a frequency multiplier. FIG. 2 is an example of a standard double conversion circuit utilizing a frequency multiplier to generate LO2.

In FIG. 2, an input signal is coupled to one input of a first mixer 300 and the output of a local oscillator 302, which generates a first conversion signal ($LO_1$), is coupled to the other input of the first mixer 300. The frequency of the converted signal is equal to the sum of the frequencies of the input signal and first conversion signal generated by the local oscillator 302. The local oscillator output is also coupled to a frequency doubler circuit 304 which outputs a second conversion signal ($LO_2$) at twice the frequency of the first conversion signal. The first converted signal ($IF_1$) and second conversion signal ($LO_2$) are input to a second mixer 306 which generates a second converted signal ($IF_2$) having a frequency equal to the sum of the frequencies of the input signal, the local oscillator signal, and double the local oscillator signal. In other words, the double converted output signal is equal in frequency to the input frequency plus three (3) times the local oscillator ($LO_1$) frequency. Thus, the system of FIG. 2 requires two mixers 300 and 306 and a doubler circuit 304.

As integrated transceiver components become more common in consumer products the need for inexpensive circuit components has become critical. The simplification of frequency multiplying and mixing circuits is critical to reducing the cost of devices such as cellular telephones and pagers.

SUMMARY OF THE INVENTION

The present invention provides a single circuit for both mixing a pair of signals and doubling the frequency of one signal in the pair while simultaneously suppressing the output level of the input frequency signals (Fin and LO).

According to one aspect of the invention, a push-push doubler includes a dual gate mixing element for mixing signals input to the elements. Since mixing elements are operated non-linearly, harmonic generation is naturally present. Accordingly, harmonics of the $LO_1$ signal are available in the first conversion mixer circuit.

According to another aspect of the invention, a multiplexer is coupled to the output of the mixer circuit to select an up-converted signal having a frequency equal to the sum of the frequencies of the input signals and a signal having a frequency of two times the $LO_1$ input signal frequency.

Other features and advantages of the invention will be apparent in view of the following detailed description and appended drawings.

DESCRIPTION OF THE PREFERRED EMBODIMENT

Figure 1:
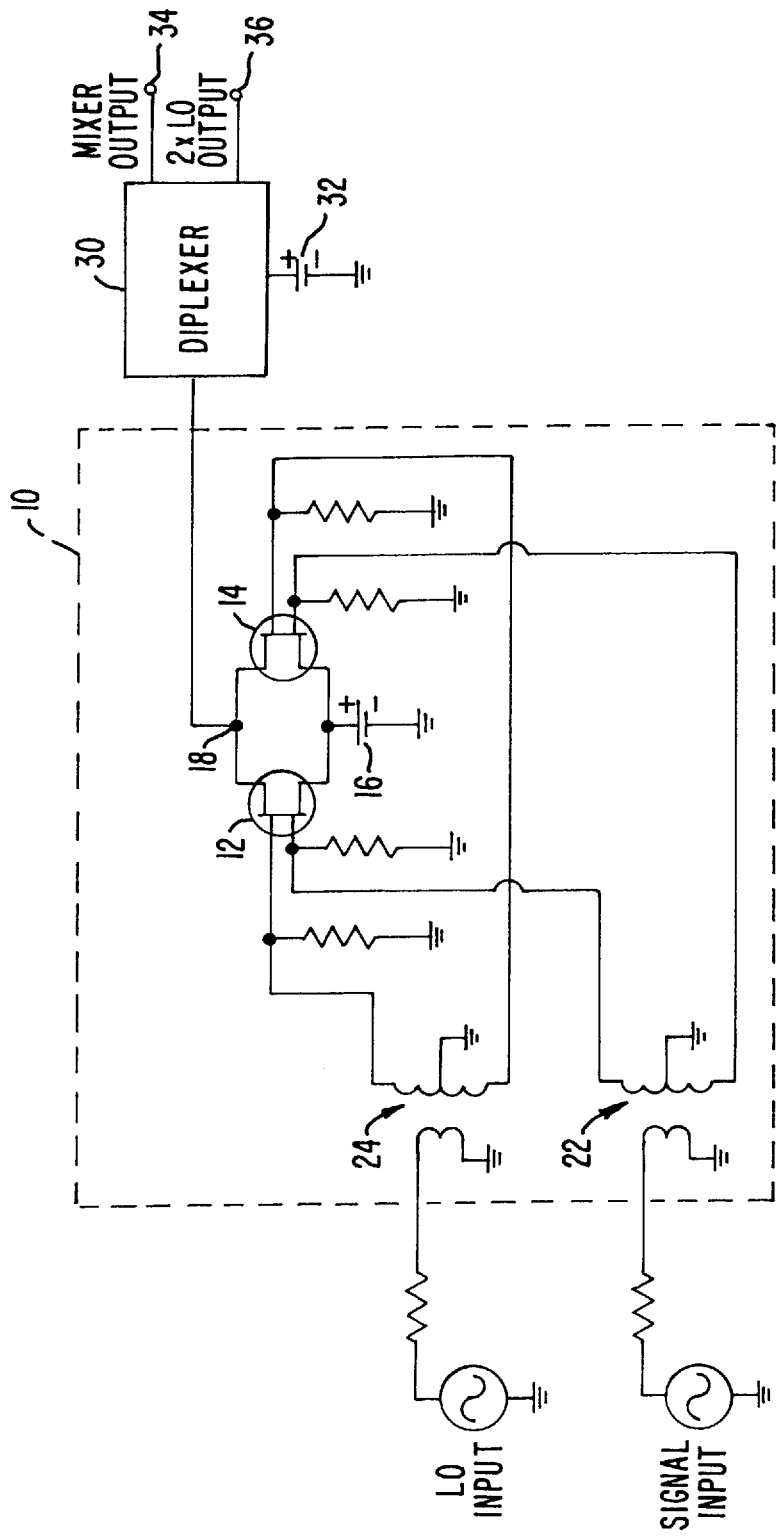
FIG. 1 is a circuit diagram of a preferred embodiment of the invention.
Figure 2:
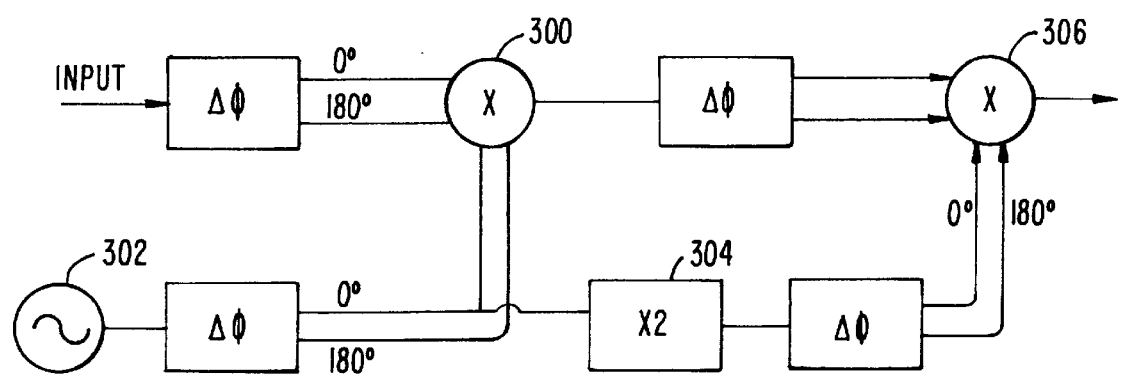
FIG. 2 is a schematic diagram of a standard dual conversion circuit.

A first embodiment of the invention, as depicted in FIG. 1, includes a push-push doubler including dual-gate FETs as the mixing elements.

Referring now to FIG. 1, the push-push mixer 10 includes first and second dual-gate FET transistors 12 and 14. The sources of the FET transistors are tied to a reference voltage 16, VSS, and the drains are coupled to the mixer output port 18.

An input signal is coupled to a first phase-inverter circuit 22 and a local oscillator (LO) signal is coupled to a second phase-inverter circuit 24. The phase-inverter circuits 22 and 24 are depicted as center-tapped secondaries on a coupling transformer which provide out-of-phase signals to the FET transistors 12 and 14. Other phase inverter circuits could be utilized to provide this functionality. The out-of-phase signals are comprised of signals which differ in phase by 180°. Henceforth, these signals will be referred to as the in-phase and out-of-phase signals. The in-phase component of the input signal is supplied to the first gate of the first FET transistor 12 and the out-of-phase component is supplied to the first gate of the second FET transistor 14. The in-phase component of the LO signal is supplied to the second gate of the first FET transistor 12 and the out-of-phase component is supplied to the second gate of the second FET transistor 14.

A diplexer 30, coupled to a second reference voltage 32, VDD, is coupled to the mixer output port 18. The diplexer includes first and second output ports 34 and 36. The diplexer 30 includes internal filters configured to pass a converted signal at a converted frequency, equal to the sum of the input signal frequency and LO frequency, at the first output port 34 and a doubled signal at a doubled frequency, equal to double the LO frequency, at the second output port 36.

The mixer circuit 10 also includes biasing resistors and DC-blocking capacitors that perform standard functions.

The operation of the circuit of FIG. 1 will now be described. The in and out-of-phase components of the input signal coupled to the first and second FET transistors 12 and 14 are out of phase, and therefore cancel at the output port 18. Similarly, the in and out-of-phase components of the LO signal cancel at the output port. Accordingly, the push-pull circuit does not output signals at the input frequency or the LO frequency.

The in-phase components of the input signal and LO signal are coupled to the first and second gates of the first FET 12. The first dual gate FET 12 forms the product of the in-phase components to generate an in-phase converted signal having frequency components at the sum of the frequencies of the in-phase input signal component and the in-phase LO signal component. Similarly, the out-of-phase components of the input signal and LO signal are coupled to the first and second gates of the second FET 14. The second dual gate FET 14 forms the product of out-of-phase components to generate an out-of-phase converted signal having frequency components equal to the sum of the frequencies of the out-of-phase input signal component and out-of-phase LO signal component.

The diplexer 30 includes a filter that passes only the converted signal having a frequency equal to the sum of the input signal frequency and local oscillator frequency. As described above, the frequency of the in-phase converted signal is the sum of the input signal frequency and the LO frequency. The frequencies of the out-of-phase components are each phase-shifted by 180° from the in-phase components. Thus, the converted out-of-phase component has a frequency equal to the sum of the input signal frequency, LO frequency, and phase shifts. However, the phase shifts sum to 360°, which is the same as no phase shift, so that the converted signals from both FETs are in-phase (even-mode) and add together at the mixer output port 18.

The dual gate FETs 12 and 14 are biased to operate non-linearly so quadratic terms of the input signals are generated. Each quadratic term includes a component having double the frequency of a signal coupled to the FET. Thus, the first FET 12 generates a signal at double the frequency of the in-phase component of the LO signal and the second FET 14 generates a signal at double the frequency of the out-of-phase component of the LO signal. The phase relationship of the frequency doubled signals is twice that of the phase difference of the original (undoubled) signals. Accordingly, out-of-phase signals (phase difference of 180°) will frequently double to produce in-phase signals (phase difference of 360°) frequency doubled signals. These in-phase signals can be added directly. The doubled LO signals add together at the mixer output port 18.

Accordingly, the push-push mixer 10 performs the functions of separate mixer and doubler circuits of the prior art and simplifies the implementation of a double conversion circuit which utilizes a single LO input.

The invention has now been described with reference to the preferred embodiments. Alternatives and substitutions will now be apparent to persons of ordinary skill in the art. For example, the phase-inverter circuits could be implemented by common emitter phase splitter amplifier or various other amplifier or transformer circuits. Further, a cascode connection of bipolar transistors could be substituted for the dual gate FET transistors.

Accordingly, it is not intended to limit the invention except as provided by the appended claims.

What is claimed is:

1. A balanced mixer comprising:

a first phase-inverter input unit, coupled to receive an input signal at an input signal frequency, for providing an in-phase input component and an out-of-phase input component differing in phase by 180°;

a second phase-inverter input unit, coupled to receive an LO signal at an LO frequency, for providing an in-phase LO component and an out-of-phase LO component differing in phase by 180°;

a push-push mixing stage comprising:
  a first mixing element, having first and second terminals and first and second signal ports, with said first signal port coupled to the first phase-inverter input unit to receive said input in-phase component, with said second signal port coupled to the second phase inverter input unit to receive said LO in-phase component, said first mixing element for mixing frequency components of the input and LO in-phase components and for generating frequency components at double the LO frequency of the LO in-phase component;
  a second mixing element, having first and second terminals and first and second signal ports, with said first signal port coupled to the first phase-inverter input unit to receive said input out-of-phase component, with said second signal port coupled to the second phase inverter input unit to receive said LO out-of-phase component, said second mixing element for mixing frequency components of the input and LO out-of-phase components and for generating frequency components at double the LO frequency of the LO out-of-phase component;
  with the first terminals of said first and second mixing elements coupled to a reference voltage and the second terminals of said first and second mixing elements coupled to a mixer output port; and a multiplexer, coupled to the mixer output port, having a first output for providing a converted signal having frequency components at the sum of the input signal and LO frequencies and a second output for providing a second output signal having frequency components at double the LO frequency.

2. The mixer of claim 1 wherein said multiplexer comprises:

a first filter for passing, with low attenuation, only frequency components at the sum of the input signal and LO frequencies; and a second filter for passing, with low attenuation, only frequency components at double the LO frequency.

3. The mixer of claim 1 wherein said first and second mixing elements are dual-gate FET transistors.

* * * * *